United States Patent
Saxena et al.

(10) Patent No.: US 9,952,268 B1
(45) Date of Patent: Apr. 24, 2018

(54) METHOD FOR ACCURATE MEASUREMENT OF LEAKY CAPACITORS USING CHARGE BASED CAPACITANCE MEASUREMENTS

(71) Applicant: PDF Solutions, Inc., San Jose, CA (US)

(72) Inventors: Sharad Saxena, Richardson, TX (US); Yuan Yu, San Jose, CA (US)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 15/269,851

(22) Filed: Sep. 19, 2016

Related U.S. Application Data

(60) Provisional application No. 62/220,134, filed on Sep. 17, 2015.

(51) Int. Cl.

| G01R 27/26 | (2006.01) |
|---|---|
| G01R 31/28 | (2006.01) |
| G01B 7/02 | (2006.01) |
| H01L 29/423 | (2006.01) |
| H01L 29/10 | (2006.01) |
| H01L 23/528 | (2006.01) |

(52) U.S. Cl.
CPC .......... *G01R 27/2605* (2013.01); *G01B 7/02* (2013.01); *G01R 31/2896* (2013.01); *H01L 23/528* (2013.01); *H01L 29/1037* (2013.01); *H01L 29/42364* (2013.01)

(58) Field of Classification Search
CPC ..... G01R 31/2896; G01B 7/02; H01L 23/528; H01L 29/1037; H01L 29/42364
See application file for complete search history.

(56) References Cited

U.S. PATENT DOCUMENTS

| 6,731,129 B1 * | 5/2004 | Belluomini | ........ G01R 27/2605 324/678 |
|---|---|---|---|
| 6,737,870 B2 * | 5/2004 | Okagaki | ............ G01R 27/2605 324/519 |
| 2004/0227527 A1 * | 11/2004 | Bortesi | .............. G01R 27/2605 324/676 |

* cited by examiner

*Primary Examiner* — Ajay Ojha
(74) *Attorney, Agent, or Firm* — Pillsbury Winthrop Shaw Pittman LLP

(57) ABSTRACT

Disclosed are methods for measuring capacitance in presence of leakage in integrated circuits. In particular, it teaches a method of measuring leaky capacitors using charge based capacitance measurement (CBCM) technique taking into account parasitic resistance. Fast and accurate measurement of capacitances allows the estimation of a number of technology parameters like: gate-dielectric thickness, gate critical dimension, trench depth in a damascene metallization process, height of a fin in a Fin FET device etc.

15 Claims, 3 Drawing Sheets

Leaky Capacitor with series resistance

Leaky Capacitor with series resistance

METHOD FOR ACCURATE MEASUREMENT OF LEAKY CAPACITORS USING CHARGE BASED CAPACITANCE MEASUREMENTS

RELATED APPLICATIONS

This application claims the benefit of U.S. Provisional Patent Application Ser. No. 62/220,134 filed Sep. 17, 2015 and is incorporated herein in its entirety.

BACKGROUND OF THE INVENTION

Field of the Invention

Embodiments of the present invention relate to robust measurement techniques of capacitance in an integrated circuit.

Brief Description of the Prior Art

Capacitance is a critical parameter that governs the functioning of a wide class of electrical circuits. In particular, capacitance governs the performance and proper functioning of integrated circuits. Continued scaling of CMOS technology makes it critical that desired and parasitic components of capacitance be estimated accurately and quickly. Reactance measurement techniques are susceptible to parasitics in the test set-up, for example, series resistance and inductance of the cables and probe needles in case of capacitance measurement. Furthermore, leakage paths add error to the measurement, for example gate leakage in MOSFET gate capacitance measurement. Charge-based capacitance measurement techniques can be made insensitive to such parasitics by choice of proper parameters. What is needed is a robust implementation of capacitance measurement that takes into account the gate leakage.

SUMMARY

This invention teaches a method to measure capacitance in presence of leakage. In particular, it teaches a method of measuring leaky capacitors using charge based capacitance measurement (CBCM) technique taking into account parasitic resistance.

Specifically, a method of monitoring performance of an integrated circuit device using a charge based capacitance measurement (CBCM) technique is disclosed, the method comprising: providing a metrology structure having a leaky capacitor, and a pseudo-inverter capable of pulling-up a voltage V; charging and discharging the leaky capacitor by the pseudo-inverter, the pseudo-inverter having a time period P and a pulse width T during which the leaky capacitor is charged; measuring a current at the pull-up voltage V; estimating a value of capacitance based on the measured current; plotting the estimated value of the capacitance versus T to obtain a value of a slope that is indicative of leakage in the leaky capacitor; and, using the value of the slope to extract a dimension of a structure in the integrated circuit device, where an accuracy of the dimension of structure is directly related to a desired performance of the integrated circuit.

Fast and accurate measurement of capacitances allows the estimation of a number of technology parameters like: gate-dielectric thickness, gate critical dimension, trench depth in a damascene metallization process, height of a fin in a Fin FET device etc.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION OF THE EMBODIMENTS

Embodiments of the present invention will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

Charge-based capacitance measurement (CBCM) and its variants like charge-injection-error-free CBCM (CIEF-CBCM) provide a fast and inexpensive method to measure capacitance. These techniques are especially suitable for implementation of on-chip test-circuitry and also as off-chip components on parallel testers. Since these techniques rely on measuring current and extracting capacitance from measured current, they are especially vulnerable to the measurement errors when the capacitor being measured has leakage. This has limited the use of CBCM family of techniques (including CIEF-CBCM) for measurement of transistor and front-end-of-the-line (FEOL) capacitances in modern integrated circuit (IC) technologies. Fast and accurate measurement of transistor and FEOL capacitances is critical to ensure proper functioning, modeling and process control and diagnosis of state-of-the-art IC manufacturing technologies. This has created a need for developing a method for charge based capacitance measurement of leaky capacitors. This disclosure describes such a method and its reduction to practice.

Figure 1:
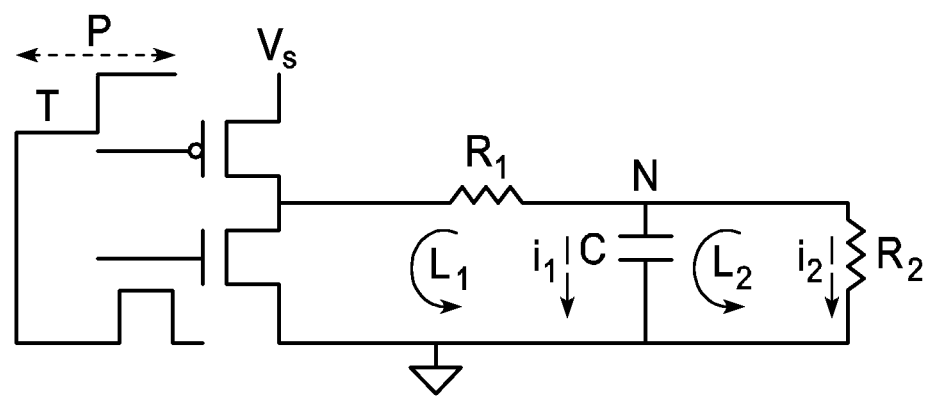
FIG. 1 shows a circuit diagram with a leaky capacitor (C in parallel with resistor R2) being charged and discharged by a pseudo-inverter, as required by CBCM techniques; according to an embodiment.

FIG. 1 shows a circuit diagram with a leaky capacitor (C in parallel with R2) being charged and discharged by a pseudo-inverter, as required by CBCM techniques. The pseudo-inverter in this embodiment comprises a switch comprising a pull-up transistor and a pull-down transistor, as shown. The transistors may be PMOS or NMOS or CMOS transistors. Other configurations of the switch are also within the scope of the invention. FIG. 1 shows the pull-up as a PMOS, but also applies to designs where the pull-up is a complementary CMOS or other switches which allows both full rail to rail voltages to be pulled-up.

In this figure R1 is a parasitic resistance of any cabling, P is the period of the clock supplying the pseudo-inverter and T is the time for which the PMOS of the pseudo inverter is LOW, that is the PMOS is turned on and the capacitor is charged. In other words, T is the pulse width and P is the time period. V is the voltage at which the capacitance is to be measured. Parasitic inductances L is also shown.

For the circuit shown in FIG. 1, under some general conditions, it can be shown that:

$$C_{meas} = \frac{I}{Vf} = C + \frac{T}{R_2}$$

where $C_{meas}$ is the measured value of the capacitance; I is the measured current for the time period P with pulse width T; V is the voltage applied to the pseudo-inverter; f is the frequency of the pulse; C is the true value of the capacitance, and $R_2$ is the value of the resistor. T can be a fixed or varying fraction of P.

The above equation provides method for estimating the true capacitance C: it will be the intercept of linear regression of Cmeas v. T. Furthermore, the slope of the regression will provide the estimate of leakage.

Figure 2:
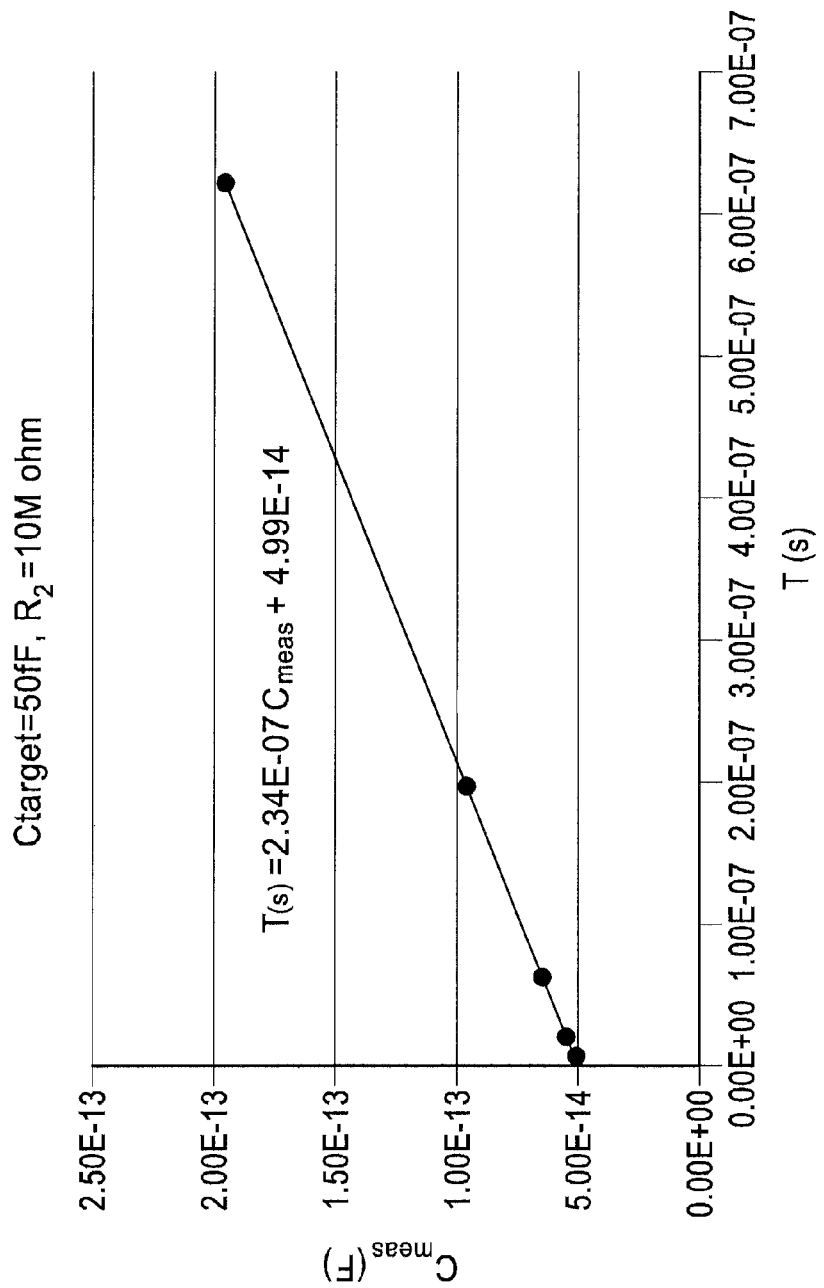
FIG. 2 shows simulation of a 50 fF capacitance with parasitic parallel resistance 10 M ohm.

The above approach has been validated by simulation and measurements. FIG. 2 shows simulation of a 50 fF capacitor with 10 Mohm resistor in parallel. The extracted capacitance value 49.99 fF was very close to the target value of 50 fF. Similar simulations have been performed for other values of the resistor, e.g., 1 Mohm, 100 Kohm etc. Example clock period for simulation can be P=1 µs-100 µs, and parasitic inductance value may be taken as 100 nH to 1 µH to show robustness of extracted capacitance to parasitic L and R.

Figure 3:
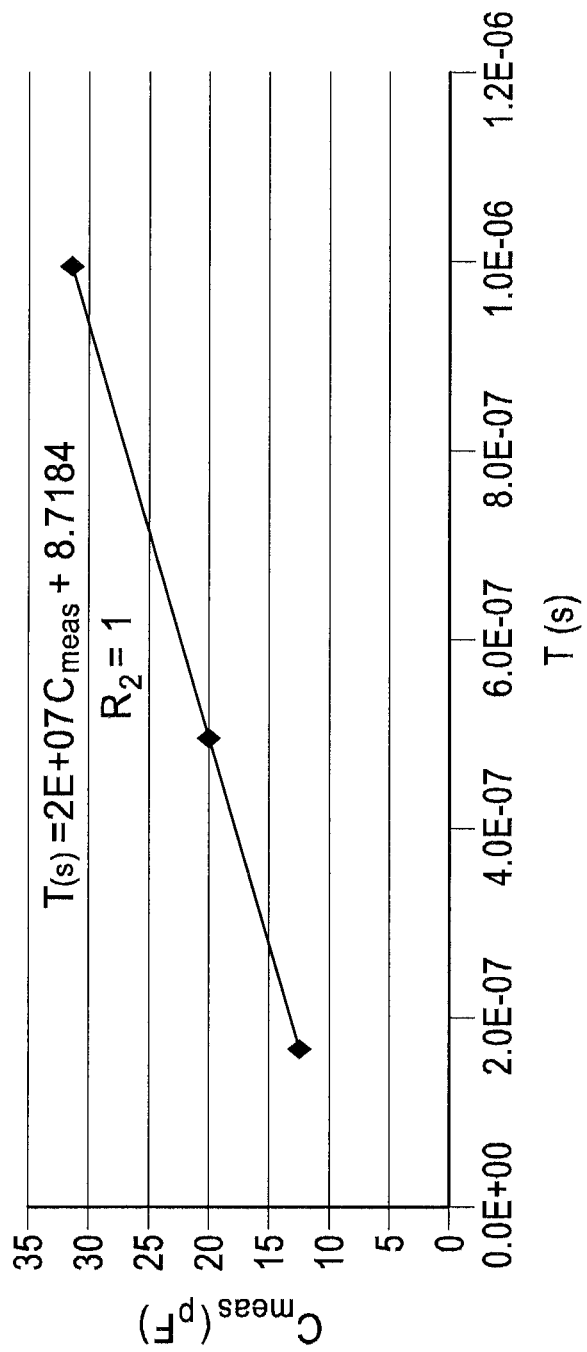
FIG. 3 shows the dependence of measured transistor gate capacitance in a 28 nm technology. The expected linear dependence is seen, allowing the extraction of the true capacitance.

FIG. 3 shows the dependence of measured transistor gate capacitance in an illustrative non-limiting case using 28 nm technology. The expected linear dependence is seen, allowing the extraction of the true capacitance. FIG. 3 shows how the value of the thickness of an oxide layer (gate dielectric in inversion) is extracted from the measured capacitance at inversion ($C_{inv}$). Fast and accurate measurement of capacitances allows the estimation of a number of technology parameters, a non-exhaustive list of which may include: gate-dielectric thickness, gate critical dimension, trench depth in a damascene metallization process, height of a fin in a Fin FET device etc.

The invention has been described in terms of particular embodiments. Other embodiments are within the scope of the following claims. For example, the steps of the invention can be performed in a different order and still achieve desirable results. While certain representative embodiments and details have been shown for purposes of illustrating the invention, it will be apparent to those skilled in the art that various changes in the methods and apparatus disclosed herein may be made without departing from the scope of the invention which is defined in the appended claims.

The invention claimed is:

1. A method of monitoring performance of an integrated circuit device using a charge based capacitance measurement (CBCM) technique, the method comprising:
   providing a metrology structure having a leaky capacitor in a wafer that is disposed adjacent another wafer containing or contains the integrated circuit device, and a pseudo-inverter capable of pulling-up a voltage V;
   charging and discharging the leaky capacitor in the wafer that is disposed adjacent the another wafer containing or contains the integrated circuit device by the pseudo-inverter, the pseudo-inverter having a time period P and a pulse width T during which the leaky capacitor is charged;
   measuring a current at the pull-up voltage V;
   estimating a value of capacitance of the leaky capacitor based on the measured current;
   plotting the estimated value of the capacitance of the leaky capacitor in the wafer that is disposed adjacent the another wafer containing or contains the integrated circuit device versus T to obtain a value of a slope that is indicative of leakage in the leaky capacitor in the wafer that is disposed adjacent the another wafer containing or contains the integrated circuit device; and
   using the value of the slope to extract a dimension of a structure in the integrated circuit device, wherein the dimension is associated with the leaky capacitor in the wafer that is disposed adjacent the another wafer containing or contains the integrated circuit device, where an accuracy of the dimension of the structure associated with the leaky capacitor is directly related to an accurate monitoring of the performance of the integrated circuit device.

2. The method of claim 1, wherein the metrology structure further comprises a resistor in parallel with the leaky capacitor that is also disposed in the wafer that is disposed adjacent the another wafer containing or contains the integrated circuit device, and the slope is calculated for different values of the resistor.

3. The method of claim 2, wherein estimating the value of the capacitance includes using the following equation:

$$C_{meas} = \frac{I}{Vf} = C + \frac{T}{R_2}$$

where $C_{meas}$ is the measured value of the capacitance; I is the measured current for the time period P with pulse width T; V is the voltage applied to the pseudo-inverter; f is the frequency of the pulse; C is the true value of the capacitance, and $R_2$ is the value of the resistor.

4. The method of claim 1, wherein the pseudo-inverter constitutes a switch comprising a pull-up transistor and a pull-down transistor.

5. The method of claim 1, wherein the CBCM technique comprises a charge-injection-error-free (CIEF) CBCM technique.

6. The method of claim 1, wherein the metrology structure is disposed on the wafer that contains the integrated circuit device to be fabricated.

7. The method of claim 1, wherein the metrology structure is disposed on the wafer that is adjacent to the another wafer that contains the integrated circuit device during fabrication.

8. The method of claim 1, wherein the leaky capacitor is part of the front-end-of-the-line (FEOL) capacitors in the integrated circuit.

9. The method of claim 1, wherein the dimension extracted from the value of the slope comprises thickness of a gate dielectric in the integrated circuit.

10. The method of claim 1, wherein the dimension extracted from the value of the slope comprises height of a fin in a FinFET device.

11. The method of claim 1, wherein the dimension extracted from the value of the slope comprises critical dimension of a gate.

12. The method of claim 1, wherein the dimension extracted from the value of the slope comprises trench depth in a damascene metallization process.

13. The method of claim 1, wherein the metrology structure includes a parasitic series resistance.

14. The method of claim 3, wherein the metrology structure is disposed on the wafer that has the integrated circuit device to be fabricated.

15. The method of claim 3, wherein during fabrication the metrology structure is disposed on the wafer that is adjacent to the wafer having the integrated circuit device.

* * * * *